United States Patent [19]

Horng et al.

[11] 4,339,767
[45] Jul. 13, 1982

[54] HIGH PERFORMANCE PNP AND NPN TRANSISTOR STRUCTURE

[75] Inventors: Cheng T. Horng, San Jose, Calif.; Richard R. Konian, Poughkeepsie, N.Y.; Robert O. Schwenker, San Jose, Calif.; Armin W. Wieder, Starnberg, Fed. Rep. of Germany

[73] Assignee: International Business Machines Corporation, Armonk, N.Y.

[21] Appl. No.: 146,921

[22] Filed: May 5, 1980

[51] Int. Cl.[3] .................. H01L 27/02; H01L 29/04
[52] U.S. Cl. ........................ 357/44; 357/49; 357/50; 357/59; 357/35
[58] Field of Search .................. 357/44, 49, 50, 35, 357/59

[56] References Cited

U.S. PATENT DOCUMENTS

| 3,600,651 | 8/1971 | Duncan | 317/235 R |
|---|---|---|---|
| 3,648,125 | 3/1972 | Peltzer | 317/235 |
| 3,730,786 | 5/1973 | Ghosh | 148/175 |
| 4,103,415 | 8/1978 | Hayes | 29/571 |
| 4,148,054 | 4/1979 | Hart et al. | 357/44 |
| 4,157,269 | 6/1979 | Ning | 148/1.5 |
| 4,159,915 | 7/1979 | Anantha | 148/1.5 |
| 4,160,991 | 7/1979 | Anantha | 357/49 |
| 4,318,751 | 3/1982 | Horng | 357/59 X |
| 4,319,932 | 3/1982 | Jambotkar | 357/59 X |

OTHER PUBLICATIONS

Cheng, *IBM Tech. Discl. Bull.*, vol. 17, No. 1, Jun. 1974, p. 21.

Feth et al., *IBM Tech. Discl. Bull.*, vol. 22, No. 7, Dec. 1979, p. 2939.

Processing For a Lateral PNP In the Submicron Range by A. W. Wieder, IBM Technical Disclosure Bulletin, vol. 21, No. 10, Mar. 1979, pp. 4050–4052.

Self-Aligned Integrated NPN (Vertical) and PNP (Lateral) Structures by T. H. Yeh, IBM Technical Disclosure Bulletin, vol. 22, No. 9, Feb. 1980, pp. 4047–4051.

Method of Producing A Lateral Transistor by H. H. Berger, vol. 23, No. 3, Aug. 1980, pp. 1089–1090.

Improved NPN Process and Structure by F. Barson, IBM Technical Disclosure Bulletin, vol. 23, No. 9, Feb. 1981, pp. 4166–4167.

*Primary Examiner*—Martin H. Edlow
*Attorney, Agent, or Firm*—Wesley DeBruin

[57] ABSTRACT

Disclosed is the fabrication and structure of very small integrated circuit devices of both PNP and NPN types with very high speeds and low power requirements. The structure provides vertical NPN and lateral PNP transistors formed within the same semiconductor chip. The base width of the lateral PNP transistor is very narrow (approximately 300 to 400 nanometers). This narrow dimension is in part obtained by using a well defined chemically vapor deposited (CVD) oxide mask instead of conventional lithographic masking. To eliminate the emitter current injecting into the substrate the P+ emitter and P+ collector of the PNP transistor are bounded by a silicon nitride and silicon dioxide dielectric layer.

3 Claims, 24 Drawing Figures

HIGH PERFORMANCE PNP AND NPN TRANSISTOR STRUCTURE

FIELD OF THE INVENTION

The invention relates to the fabrication and structure of very small integrated circuit devices of both PNP and NPN types having very high speeds and low power requirements.

CROSS REFERENCE TO RELATED APPLICATIONS

U.S. patent application Ser. No. 093,666 entitled "Semiconductor Structure with Improved Gain and Method for Manufacture Thereof" filed Nov. 13, 1979 by I. E. Magdo et al.

U.S. patent application Ser. No. 077,699 entitled "High Performance Bipolar Transistors Fabricated by Post Emitter Base Implantation Process" filed Sept. 21, 1979 by C. T. Horng et al, U.S. Pat. No. 4,242,791 granted Jan. 6, 1981.

U.S. patent application Ser. No. 098,588 entitled "A Self-Aligned Micrometer Bipolar Transistor Device and Process" filed Nov. 29, 1979 by C. T. Horng et al.

U.S. patent application Ser. No. 099,695 entitled "Vertical PNP Transistor Structure with Shallow Emitter and Method For Manufacturing Same" filed Dec. 3, 1979 by I. E. Magdo.

U.S. patent application Ser. No. 113,168 entitled "Integration of Vertical PNP and NPN Transistors" filed Jan. 18, 1980 by I. E. Magdo et al.

BACKGROUND OF THE INVENTION AND PRIOR ART

Numerous integrated circuit devices, structures and techniques of fabricating same, are known to the prior art. The following prior art patents and summaries are submitted to generally represent the state of the art.

Reference is made to U.S. Pat. No. 3,600,651 entitled "Bipolar and Field Effect Transistor Using Polycrystalline Epitaxial Deposited Silicon" granted Aug. 17, 1971 to D. M. Duncan. The Duncan patent discloses adjacent layers of single crystalline and polycrystalline semiconductor material located upon a semiconductor substrate. The single crystalline layer provides for the active regions of a semiconductor device while the adjacent polycrystalline layers provide for lateral contacts to the active regions.

Reference is made to U.S. Pat. No. 3,648,125 entitled "Method of Fabricating Integrated Circuits with Oxidized Isolation and the Resulting Structure" granted Mar. 7, 1972 to D. L. Peltzer. The Peltzer patent discloses a thin silicon epitaxial layer, formed on a silicon substrate, subdivided into electrically isolated pockets by a grid of oxidized regions of epitaxial silicon material which extend through the epitaxial layer to a laterally extending PN junction.

Reference is made to U.S. Pat. No. 3,730,786 entitled "Performance Matched Complementary Pair Transistors" granted May 1, 1973 to H. N. Ghosh. The Ghosh patent discloses a method for fabricating a complementary pair of transistors having closely matched characteristics. A high performance NPN transistor is matched to a PNP transistor whose performance is upgraded through the use of a doped oxide for simultaneously diffusing the base of the PNP transistor and the emitter of the NPN transistor. After the base diffusion is completed, the doped oxide is etched away only from the base region of the PNP transistor and diffusion conditions are re-established. The base doping of the PNP transistor then redistributes to produce a lower surface concentration and a sharper gradient at the collector base junction while the doped oxide remaining over the NPN emitter acts as a continuing source of emitter impurity for enhanced emitter efficiency.

Reference is made to U.S. Pat. No. 4,103,415 entitled "Insulated-Gate Field-Effect Transistor with Self-Aligned Contact Hole to Source or Drain" granted Aug. 1, 1978 to J. A. Hayes. The Hayes' patent discloses an oxide dielectric layer interposed between the polysilicon gate and the contact hole to the source or drain of an insulated-gate field-effect transistor to prevent electrical shorts between the gate and metal contact to the source or drain. The oxide dielectric layer enables the contact hole to be extremely close to the polysilicon gate without electrical shorts occurring therebetween, thereby eliminating the need for a minimum separation between the gate and contact hole.

Reference is made to U.S. Pat. No. 4,157,269 entitled "Utilizing Polysilicon Diffusion Sources and Special Masking Techniques" granted June 5, 1979 to T. H. Ning. The Ning patent discloses a method consisting of a sequence of process steps for fabricating a bipolar transistor having base contacts formed of polysilicon material and an emitter contact formed of polysilicon material or metal. The emitter contact is self-aligned to the base contacts by the use of process steps wherein a single mask aperture is used for defining the base contacts and the emitter.

Reference is made to U.S. Pat. No. 4,159,915 entitled "Method For Fabrication Vertical NPN and PNP Structures Utilizing Ion-Implantation" granted July 3, 1979 to N. G. Anantha. The Anantha et al. patent discloses a method for fabricating vertical NPN and PNP structures on the same semiconductor body. The method involves providing a monocrystalline semiconductor substrate having regions of monocrystalline silicon isolated from one another by isolation regions. Buried regions are formed overlapping the juncture of the substrate and epitaxial layer and are located in at least one of the regions of isolated monocrystalline silicon. The P base region in the NPN designated regions and a P reach-through in the PNP designated regions are formed simultaneously. The emitter region in the NPN regions and base contact region in the PNP regions are then formed simultaneously. The P emitter region in the PNP regions is then implanted by suitable ion implantation techniques. A Schottky Barrier collector contact in the PNP regions are formed. Electrical contacts are then made to the PNP and NPN transistor elements. A PNP device may be fabricated without the formation of an NPN device if it is so desired.

Reference is made to U.S. Pat. No. 4,160,991 entitled "High Performance Bipolar Device and Method for Making Same" granted July 10, 1979 to N. G. Anantha et al. The Anantha et al patent discloses a method for manufacturing a high performance bipolar device and the resulting structure which has a very small emitter-base spacing. The small emitter-base spacing, reduces the base resistance compared to earlier device spacing and thereby improves the performance of the bipolar device. The method involves providing a silicon semiconductor body having regions of monocrystalline silicon isolated from one another by isolation regions and a buried subcollector therein. A base region is formed in the isolated monocrystalline silicon. A mask is formed on the surface of the silicon body covering those regions designated to be the emitter and collector reach-through regions. A doped polycrystalline silicon layer is then formed through the mask covering the base region and making ohmic contact thereto. An insulating layer is formed over the polysilicon layer. The mask is removed from those regions designated to be the emitter and collector reach-through regions. The emitter junction is then formed in the base region and the collector reach-through formed to contact the buried sub-collector. Electrical contacts are made to the emitter and collector. The doped polycrystalline silicon layer is the electrical contact to the base regions.

Reference is made to the IBM Technical Disclosure Bulletin publication entitled "Complementary Bipolar Device Structure" by J. J. Chang et al., June 1974, Volume 17, No. 1, pages 21 and 22.

Reference is made to the IBM Technical Disclosure Bulletin publication entitled "Thin-Base Lateral PNP Transistor Structure" by G. C. Feth et al., December 1979, Volume 22, No. 7, pages 2939 through 2942.

The present trend in semiconductor technology is toward large scale integration of devices with very high speed and low power performance. The parameters that are essential to such high performance bipolar transistor are low parasitic capacitances as realized by (a) shallow vertical junction structure and (b) small horizontal geometry. To achieve these goals it is necessary to make the devices in the integrated circuits as small as possible.

With the advance in semiconductor processing technologies, such as in the fields of ion implantation, deep dielectric isolation, electron beam and x-ray lithographies, reactive ion etching, advanced insulator and polysilicon deposition techniques, and metal lift-off processes, fabrication of the ultra-high performance integrated circuit devices can be achieved.

Ion-implantation provides a means for precisely controlling the total amount of impurity transferred to the wafer. The impurity depth distribution is accurately controlled by implant energy. Unlike the conventional thermal diffusion process ion implantation is not a high temperature process. Thus, by using photo-resist or metal masking, multiple impurity introduction operations can be achieved without resort to high temperatures. A final thermal drive-in diffusion is sufficient to anneal out the radiation damage caused by implantation, and obtain desired device junction depth. Consequently, integrated circuit devices can be made shallower, with greater precision of the impurity distribution using ion implantation technology.

As the semiconductor devices become shallower, it is desirable to reduce the overall junction area so as to reduce parasitic capacitance. Further reduction of device parasitic capacitance can be achieved by shrinking of device horizontal dimensions and using dielectric isolation. Dielectric isolation is a method of fabricating integrated circuits in which the device components are isolated by other than P-N junctions. A well known dielectric isolation namely "Recessed Oxide Isolation" (ROI) is a commonly used process in present day semiconductor technology. Using $Si_3N_4$ as the oxidation barrier, the ROI technique is done by etching grooves into the semiconductor wafer adjacent those regions in which PN junctions are to be formed. The silicon exposed by the grooves is then thermally oxidized to form recessed oxide regions providing dielectric isolation. The problem associated with the ROI is the formation of "bird's head" and "bird's beak" structure at the lateral edges of recessed oxide. The bird's head is undesirable because it can cause breaks or discontinuities in thin films covering the steps. The indefiniteness of bird's beak structure reduces the available active surface area and, therefore, imposes the need for wider tolerance of lateral dimension in the integrated circuit layout. A newly developed oxide isolation called "Deep Dielectric Isolation" (DDI) avoids the above mentioned ROI problem. The DDI process utilizes reactive-ion etching (RIE) to form deep narrow trenches into the wafer surrounding those regions in which devices are to be formed. [Reference is made to U.S. Pat. No. 4,104,086, entitled "Method For Forming Isolated Regions of Silicon Utilizing Reactive Ion Etching" granted Aug. 1, 1978 to J. A. Bondur et al., and U.S. Pat. No. 4,139,442 entitled "Reactive Ion Etching Method For Producing Deep Dielectric Isolation in Silicon" granted Feb. 13, 1979 to J. A. Bondur et al., respectively assigned to the assignee of the subject application]. The trenches are overfilled with $SiO_2$ put down by chemical vapor deposition (CVD) technique. The overfilled $SiO_2$ also planarizes the device surface. A blanket RIE back-etching to the semiconductor surface yields deep oxide isolation trenches. Unlike the bird's beak in ROI structure, sidewall of the DDI structure is nearly vertical. The surface of DDI regions and the silicon where devices are to be formed are coplanar. With the DDI, doping process for various device regions is then self-aligned by oxide isolation. The self-aligned process eliminates precise mask alignment steps and also saves a number of mask steps in the device fabrication.

As mentioned above the DDI enable us to form devices with considerably smaller cell size than those formed by using either P-N isolation or by ROI. Further reduction of device horizontal dimensions requires the use of high resolution capabilities of lithography and etching processes. The electron beam lithography is the most promising method for delineating submicron size device patterns. For device window opening the reactive ion etching (RIE) is the most attractive alternative of the conventional wet solution etching. The RIE is a dry process having directional etching characteristic. The etched device windows preserve the lithography defined etch mask dimensions, and the openings have vertical sidewalls. Thus, the E-beam lithography and reactive ion etching are compatible for fabricating very small device geometries.

For the very small bipolar transistor devices, as for example, micron size transistors, the base areas and, therefore, the collector-base parasitic capacitance is the most significant performance parameter. In the bipolar transistor the active base area is the region below the emitter. In the conventional transistors, fabricated by the prior art, the base contacts are formed above the inactive base area surrounding the emitter. The transistor base area that is needed to accommodate the emitter and base contacts is considerably larger than the active base area. To reduce the base area for making ultra-high performance bipolar transistors, a different approach in making base contact is desirable.

While the fabrication of complementary pairs of transistors on a common semiconductor substrate is highly desirable, the various efforts directed to producing complementary pairs of transistors have not been wholly successful. It would be desirable to provide complementary pairs of transistor devices on a common semiconductor substrate wherein each transistor (NPN and PNP) has high performance characteristics.

The invention is directed to the fabrication and structure of very small integrated circuit devices of both PNP and NPN type with very high speeds and low power requirements.

The most common technique for producing high speed logic circuits is the integration of NPN and PNP transistors within the same chip. Generally, a vertical NPN and a lateral PNP are used. The vertical NPN can be made very small in basewidth, as has been shown in prior art. An example of techniques for optimization of a vertical NPN is disclosed and claimed in the afore-identified pending Horng et al. U.S. patent application Ser. No. 098,588 filed Nov. 29, 1979 where the structure has a narrow basewidth, small junction area and a highly conductive polysilicon area surrounding the device which greatly reduces base resistance values. Commonly lateral PNP's are defined by lithographic masking techniques which must limit the basewidth to being either very wide (such as two micrometers or greater) or extremely variable. Another problem associated with junction isolated PNP's is that a large part of the emitter current is lost to the substrate. The combination of these effects results in low gain (for example, five or less) for lateral PNP devices.

In accordance with the invention, the afore-recited problems for the lateral PNP are solved by having the basewidth made smaller by using a controllable chemical vapor deposition (CVD) process to determine the basewidth. The problem of current injection into the substrate from the emitter and collector regions is obviated by the presence of an oxide isolation below these regions.

SUMMARY OF THE INVENTION

The primary object of the invention is to provide an improved complementary transistor (NPN and PNP) structure and method of fabricating same.

In accordance with the invention an integrated circuit structure includes: a micrometer NPN transistor and a micrometer PNP transistor, said structure including a silicon substrate having a planar surface including a thin epitaxial layer, said epitaxial layer having recessed oxidized isolation regions and P type polysilicon regions formed therein, said integrated circuit structure being characterized as follows: a first electrically isolated P type polysilicon region formed in said epitaxial layer and having at least one perpendicular sidewall; a second electrically isolated P type polysilicon region formed in said epitaxial layer and having at least one perpendicular sidewall; said sidewall of said second P type polysilicon region being oppositely disposed and spaced from said sidewall of said first P type polysilicon region; said spacing between said perpendicular sidewalls of said P type polysilicon regions providing a region of said epitaxial layer having a width of approximately 6000 to 8000 Å; a lateral PNP transistor formed in said 6000 to 8000 Å wide region of said epitaxial layer, where said first P type polysilicon region is utilized in providing an electrical contact to said emitter of said lateral PNP transistor and said second P type polysilicon region is utilized in providing an electrical contact to said collector of said lateral PNP transistor; and first and second regions of silicon dioxide respectively positioned between said first and second polysilicon regions and said silicon substrate.

Further in accordance with the invention, a process for forming on a planar surface of a P type silicon substrate an improved NPN transistor and an improved PNP transistor, said process including the following steps: form an N type region in said planar surface of said P type silicon substrate; form a thin epitaxial layer of N type silicon on said surface of said substrate; form a silicon dioxide layer on said epitaxial layer; form a silicon nitride layer on said silicon dioxide layer; form a polysilicon layer of limited area and defined placement on said silicon nitride layer; form a CVD silicon dioxide layer on the exposed surface of said substrate said silicon dioxide layer having a thickness in the order of 6000 to 8000 Å; blanket reactive ion etch the exposed surface of said substrate to said polysilicon layer and said silicon nitride layer; remove said polysilicon layer, said silicon nitride layer and said silicon dioxide layer whereby an accurately placed mask having a width in the order of 6000 to 8000 Å is formed; additional processing to provide an NPN and a PNP transistor wherein said active emitter, base and collector regions of said PNP are defined in said thin epitaxial layer within a width in the order of 6000 to 8000 Å.

BRIEF DESCRIPTION OF THE DRAWINGS

FIG. 23 is a cross-sectional view of the completed complementary transistor structure in accordance with the invention. (FIG. 23 is a crosssectional view taken along the line A—A of FIG. 24).

DESCRIPTION OF THE PREFERRED EMBODIMENT

Figure 1:
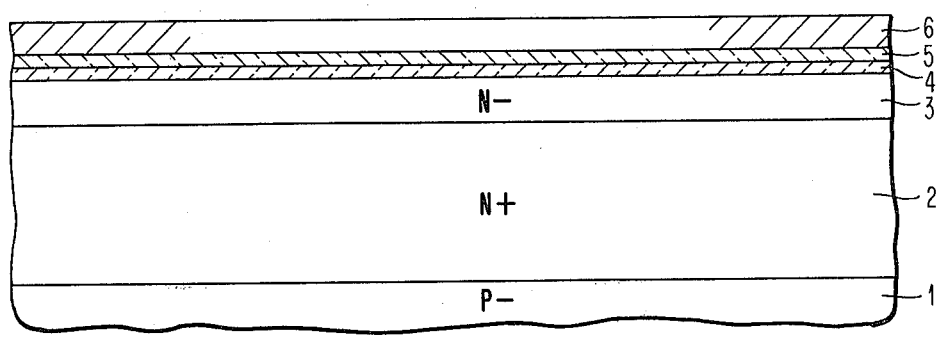
FIGS. 1 through 23 are simplified cross-sectional views of the complementary transistor structure, not to scale, showing successive stages or steps in the process in accordance with the invention.

Referring now to the drawings and FIG. 1 in particular, the starting substrate is a P-type monocrystalline silicon wafer 1 having a resistivity of 10 to 20 ohm-cm. An N-type impurity is then introduced into wafer 1 forming the N+ region 2. The impurity can be any suitable N-type impurity, as for example, arsenic, and be introduced into the wafer by any suitable technique, as for example, capsule diffusion or ion implantation. Next, an N-type epitaxial layer 3 of doping $\leq 2 \times 10^{16}$ As/cm$^3$ is deposited on the surface of the substrate. The epitaxial layer preferably has a thickness of $\leq 2$ micrometers. [Reference is made to U.S. Pat. No. 4,153,486 entitled "Silicon Tetrachloride Epitaxial Process for Producing Very Sharp Autodoping Profiles and Very Low Defect Densities on Substrates with High Concentration Buried Impurity Layers Utilizing A Preheating in Hydrogen", granted May 8, 1979 to G. R. Srinivasan and of common assignee herewith]. Still referring to FIG. 1, a chemically vapor deposited layer of silicon dioxide 4 is deposited on the surface of the substrate. The SiO$_2$ layer 4 has a thickness in the order of 200 nanometers. A silicon nitride, Si$_3$N$_4$, layer 5 is chemically vapor deposited on the silicon dioxide layer 4. The Si$_3$N$_4$ layer 5 is preferably in the order of 100 nanometers in thickness. Thereafter, a polysilicon layer 6, having a thickness of approximately 600 to 700 nanometers, is chemically vapor deposited on silicon nitride layer 5.

Figure 2:
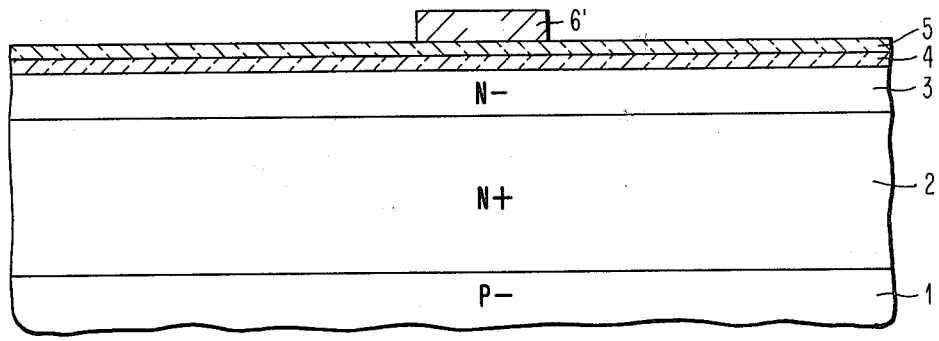

Utilizing known photolithographic techniques and reactive ion etching, remove the polysilicon layer 6 except for the portion bearing reference character 6' as depicted in FIG. 2. The importance of this reactive ion etching step is to give nearly vertical sidewalls on the etched polysilicon.

Figure 3:
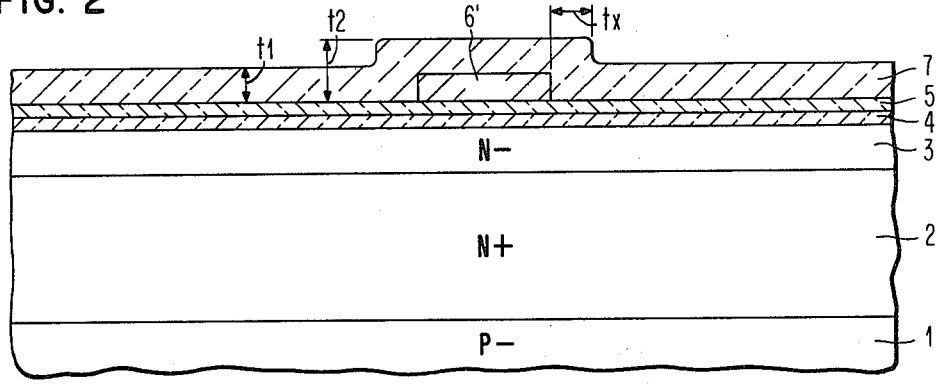

A conformal coating of silicon dioxide 7, FIG. 3 is chemically vapor deposited at a temperature of approximately 800° to 900° C. The $SiO_2$ coating 7 has a thickness t1 of approximately 800 nanometers except for portions designated by reference characters t2 and tx. The importance of this step of providing the conformal oxide coating 7 is that the value (or dimension) tx can be reproducibly controlled. The exact value of tx will depend on (1) the layer thickness t1, (2) the temperature of deposition, and (3) the sidewall angle of polysilicon layer portion 6'.

Figure 4:
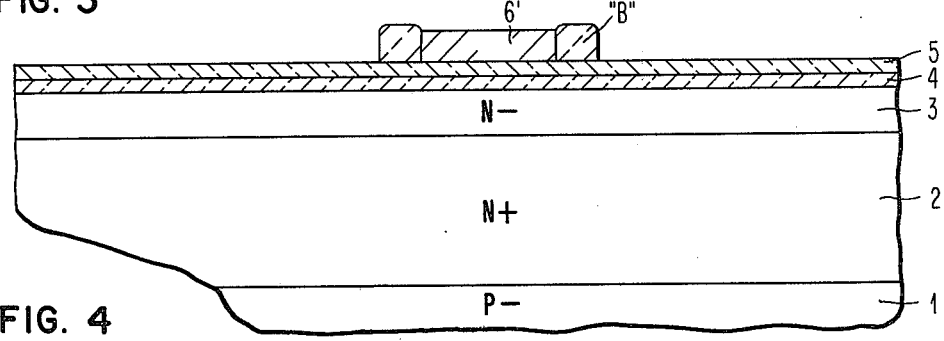

Blanket reactive ion etch (RIE) the silicon dioxide coating. As shown in FIG. 4, the etching is continued until the surface of the polysilicon layer portion 6' and the surface of silicon nitride layer 5 are exposed. It will be seen that subsequent to the RIE step only portions of the thick t2 oxide of coating 7 remain. Alternatively, the RIE step removes t1 thickness of the oxide coating 7. The $Si_3N_4$ layer 5 acts as an etch stop so that variations across the wafer in oxide thickness and in etching rate are not introduced into the lower oxide layer. The remaining portion of the conformal oxide coating, bearing reference character "B" will be used as masking for the PNP base.

Remove the polysilicon portion 6' and strip the exposed portion $Si_3N_4$ layer 5. The polysilicon is preferably removed by using chemical solution, as, for example, pyracatechol acid. The exposed portion of silicon nitride layer 5 is preferably removed by warm phosphoric acid ($H_3PO_4$).

Figure 5:
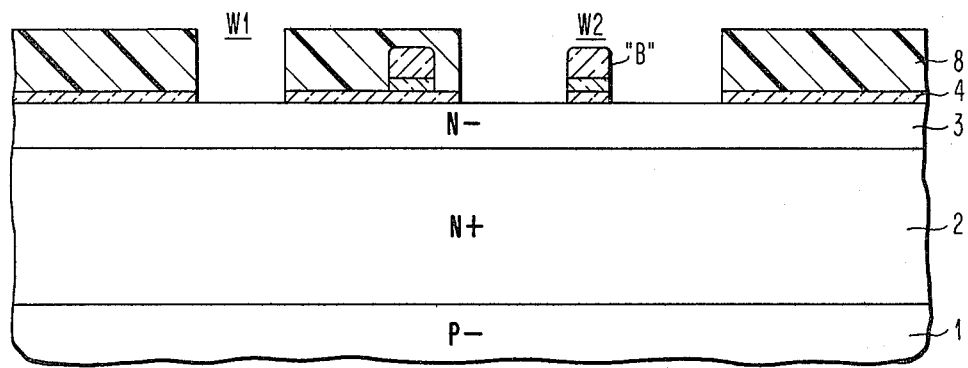

Utilizing photolithographic techniques, a photoresist mask 8 having windows W1 and W2 is formed. Using the windowed photoresist mask 8, remove the exposed portions of silicon dioxide layer 4. Only the portions of silicon dioxide layer 4, not protected by photoresist (windows W1 and W2) or by the frame "B" of $SiO_2$/$Si_3N_4$/$SiO_2$, will be removed. At this stage in the process a cross sectional view of the substrate is schematically depicted in FIG. 5.

Figure 6:
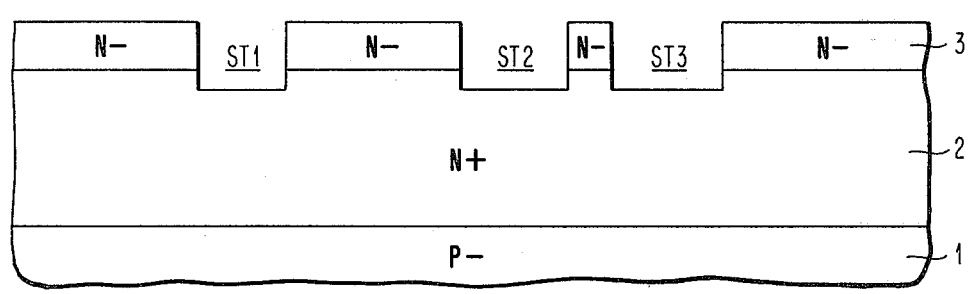

Referring to FIG. 6, the photoresist mask 8 is removed. Utilizing the remaining portions of silicon oxide layer 4 and the frame "B" of $SiO_2$/$Si_3N_4$/$SiO_2$ as a block out mask the shallow trenches ST1, ST2 and ST3 are formed by reactive ion etching of the exposed surface of the substrate. Remove the silicon dioxide and silicon nitride. The oxide is preferably removed by buffer HF solution. The silicon nitride is preferably removed by warm $H_3PO_4$ solution.

At this stage in the process, a cross-sectional view of the substrate is schematically depicted in FIG. 6. It is to be noted that the shallow trenches ST1, ST2 and ST3 each have a depth which extends through the epitaxial layer 3 into the region 2. The shallow trenches form the region between the intended collector contact and the intended base for the NPN device and between the intended base contact and the rest of the PNP device.

Figure 7:
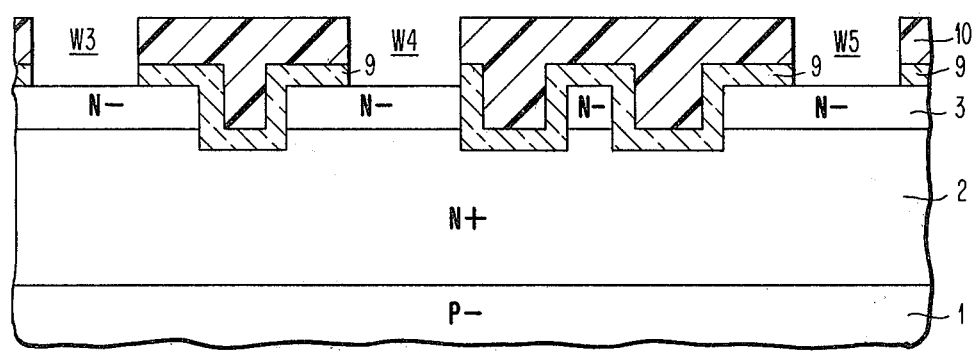

Chemically vapor deposit a layer of silicon dioxide 9 on the exposed surface of the substrate 1. The $SiO_2$ layer 9 is deposited at a temperature of 800° C. and to a thickness of approximately 700 nanometers. The next step is to form a photoresist mask 10 having windows W3, W4 and W5. Utilize reactive ion etching to remove the portions of silicon dioxide layer 9 exposed by windows W3, W4 and W5 of photoresist layer 10. At this stage in the process a cross-sectional view of the substrate is schematically depicted in FIG. 7.

Figure 8:
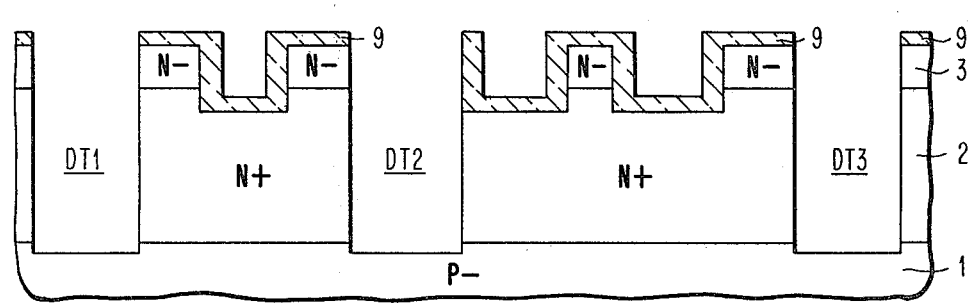

Remove photoresist layer 10. Utilizing $SiO_2$ layer 9, having windows W3, W4 and W5, as a mask reactive ion etch deep trenches DT1, DT2 and DT3. [It is to be appreciated that deep trenches DT1, DT2 and DT3 when viewed from the top, (although not expressly shown in the drawing), interconnect to form a pattern similar to the figure eight. A first enclosed portion of the interconnected deep trench encircles the to be formed NPN device whereas a second enclosed portion of the interconnected deep trench encircles the to be formed PNP device. Thus, it will be readily apparent from the following description herein, that the enclosed deep trench is utilized to electrically isolate the NPN and PNP devices]. Referring to FIG. 8, it will be seen that the deep trenches DT1, DT2 and DT3 respectively have a depth extending through said subcollector region. The depth of deep trenches is approximately four micrometers whereas the depth of the shallow trenches (ST1, ST2 and ST3) is approximately one micrometer.

Figure 9:
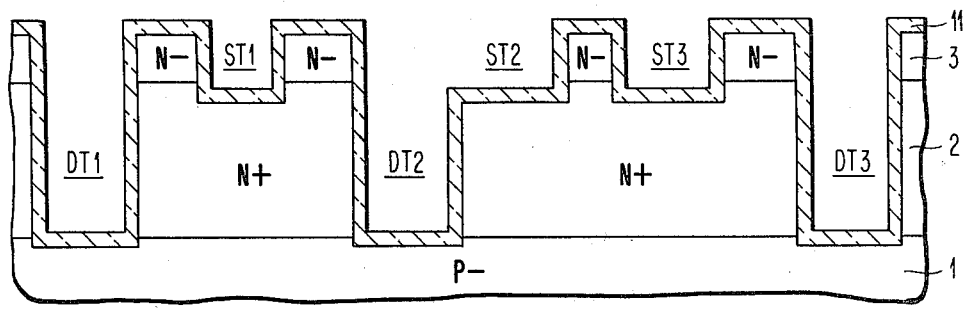

Remove the remaining portion of silicon dioxide layer 9 (FIG. 8). The $SiO_2$ is preferably removed by buffer HF solution. Thermally oxidize the exposed surface of the substrate to provide oxide layer 11. The thickness of the thermal oxide layer 11 is preferably 100 to 200 nanometers. At this stage of the process a cross sectional view of the substrate is schematically depicted in FIG. 9.

Figure 10:
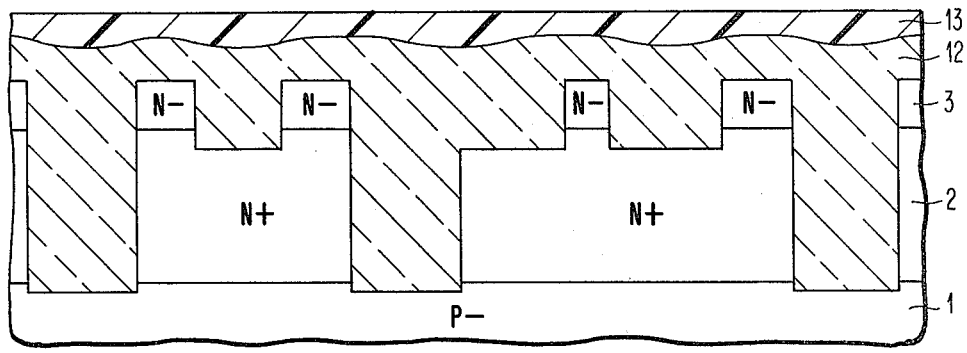
Figure 11:
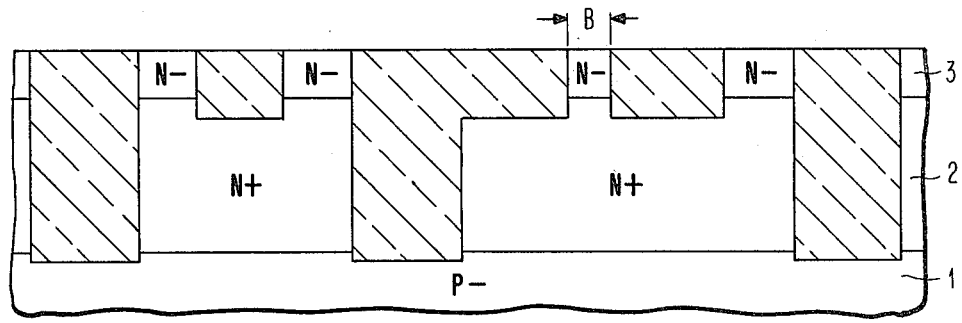

Referring to FIG. 10, a thick oxide layer 12, formed by low pressure chemically vapor deposition, is deposited to fill the shallow trenches (ST1, ST2 and ST3) and the deep trenches (DT1, DT2 and DT3). The $SiO_2$ layer 12 also tends to planarize the wafer surface. For a three micrometer wide deep trench, the oxide thickness required to overfill the trench is approximately 3 micrometers. As shown in FIG. 10, crevice formation in the center area of the overfilled trenches may be present. In this case a blanket layer of photoresist 13 may be applied and appropriately treated to planarize the surface. The subsequent process step is the use of RIE to thin back the resist layer 13 and oxide layer 12. Of primary importance is that the etch rate of RIE resist is nearly equal to that of RIE $SiO_2$. Thus, with an equal thickness of resist and $SiO_2$ over the wafer, a back-etching to the surface of the epitaxial layer 3 yields a planar surface with filled in deep trenches and shallow trenches as shown in FIG. 11. (U.S. Pat. No. 4,025,411 entitled "Fabricating Semiconductor Device Utilizing A Physical Ion Etching Process" granted May 24, 1977 to Y. Homa-ma et al: U.S. Pat. No. 4,104,090 entitled "Total Dielectric Isolation Utilizing A Combination of Reactive Ion Etching, Anodic Etching, and Thermal Oxidation" granted Aug. 1, 1978 to H. B. Pogge).

Figure 12:
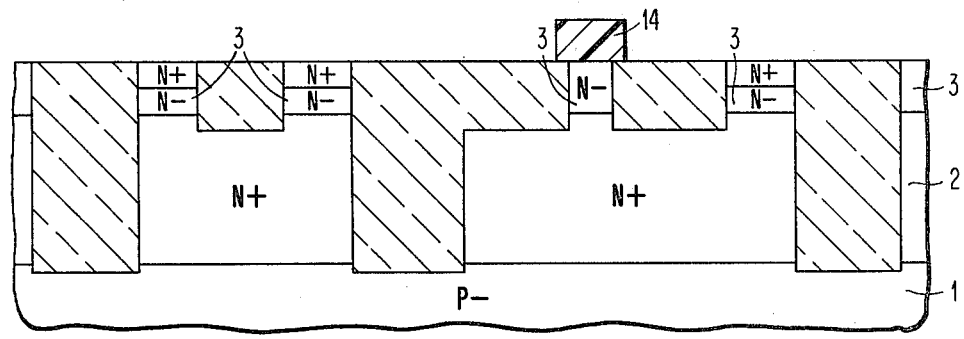

Utilizing photolithographic techniques form a photoresist block out mask 14 (FIG. 12) to block out region "B" (FIG. 11) of the epitaxial layer. Ion implant arsenic ions, $A_s^+$, into the exposed regions of the epitaxial layer, FIG. 12. The arsenic ions are implanted with an energy of 40 to 50 keV and a dose of 3 to $5 \times 10^{15}$ ions/cm$^2$. The regions implanted with arsenic are the emitter of the intended NPN device, the reach through region of the NPN device and the reach through region of the PNP device. FIG. 12 schematically depicts a cross sectional view of the substrate at this stage of the process.

Figure 13:
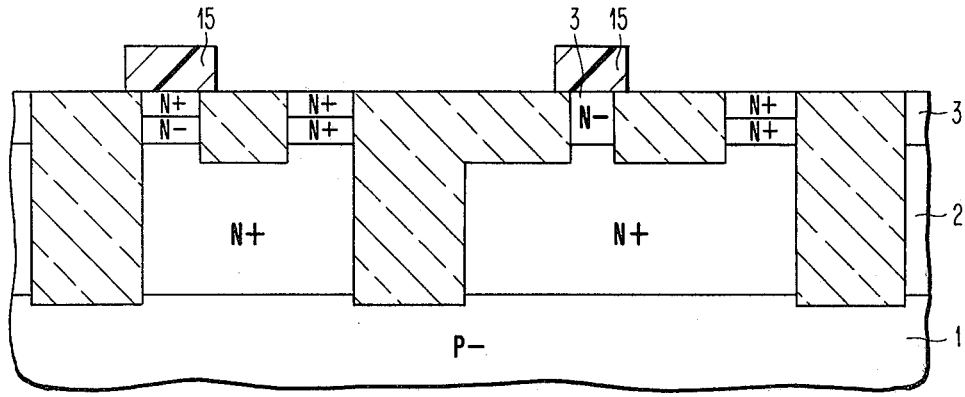

Utilizing photolithographic techniques form a photoresist block-out mask 15 (FIG. 13) to block out region "B" (FIG. 11) of the epitaxial layer 3 and also the emitter region of the to be formed NPN device. Ion implant phosphorus ions into the reach through regions, FIG. 13. (The reach through regions are the collector reach through region for the NPN device and base reach through region for the PNP device). The phosphorus ions are preferably implanted with an energy of 200 keV and a dose of $3 \times 10^{15}$ ions/cm$^2$. After removing the photoresist mask 15, employ a thermal cycle having temperature preferably of 950°-1000° C. to drive in the N+ dopants. FIG. 13 schematically depicts a cross sectional view of the substrate at this stage of the process.

Figure 14:
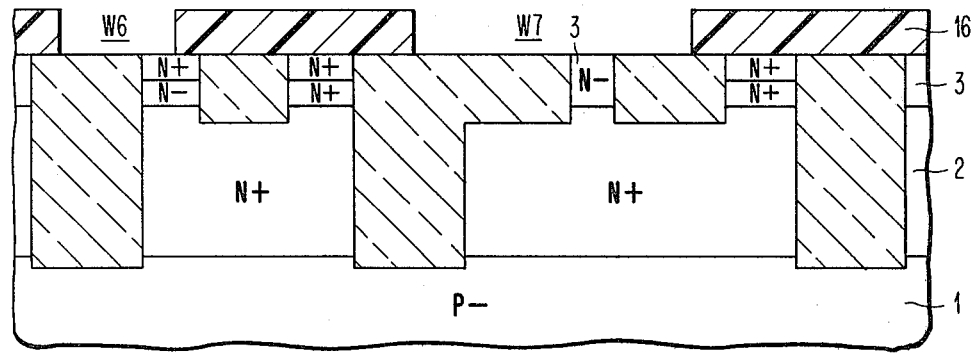
Figure 15:
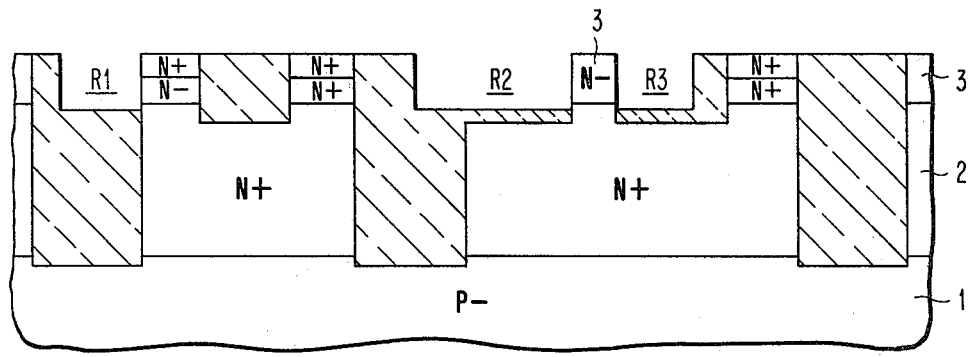

As demonstrated in FIG. 14, a photolithographic step is applied to form opening windows W6 and W7 in the resist layer to define the intended polysilicon contact regions. The exposed silicon dioxide is preferably etched by buffer HF solution. The silicon dioxide exposed through said afore recited windows is etched to a depth of approximately 600-700 nanometers. This etching step etches the regions (recesses R1, R2 and R3, FIG. 15) which will be providing contact to the base of the NPN device and to the emitter and collector of the PNP device. FIG. 15 schematically depicts a cross sectional view of the substrate at this stage of the process. It is to be noted that an oxide isolation layer of approximately 2000-3000Å thick still remains at the recesses R2 and R3 of the PNP device.

Figure 16:
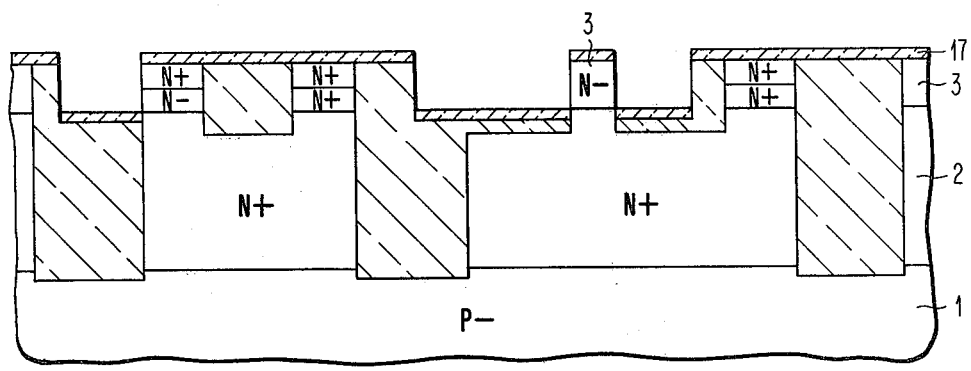

Vacuum evaporate a platinum (Pt) film 17. The Pt film is about 50 nanometers in thickness. It will be noted, as depicted in FIG. 16, that the vacuum evaporation of Pt does not result in a film on the sidewalls of the exposed surface of the substrate. A film, or layer other than platinum could be employed. The requirement is that the film is not chemically attacked by the next following process step.

Employ an etchant solution, preferably a mixture HF:HNO$_3$:CH$_3$COOH=1:3:8 to etch the exposed N+ and N− regions of the exposed surface of the substrate. [Reference is made to the article "Controlled Preferential Etching Technology" by H. Muraoka et al., in "Semiconductor Silicon", edited by H. R. Huff and R. R. Burgerss, pp 327.338, 1973]. This solution has the characteristic of etching N+silicon at an appreciably greater rate than N−silicon. Overetch the N+regions (as compared to the N−region) for a lateral distance of about 200 nanometer.

Figure 17:
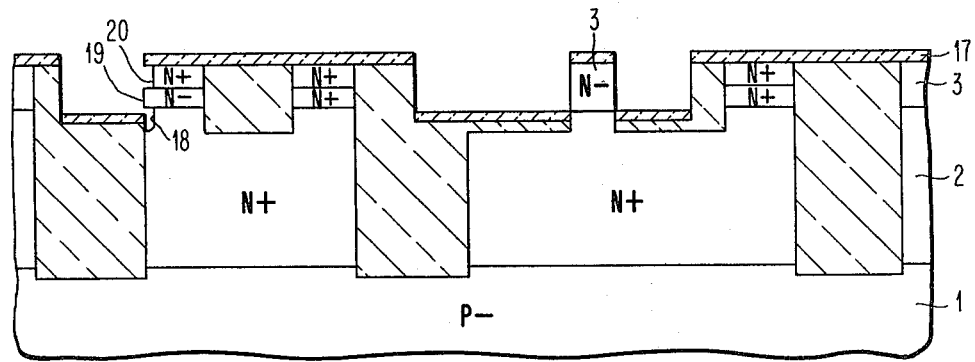

Referring to FIG. 17, it will be seen that etchant has etched N+ regions 18 and 20 an appreciable greater depth than N− region 19. Alternatively stated, the etching step has resulted in N− region being under cut as depicted in FIG. 17. The Pt film vacuum evaporated in prior step of the process protects the horizontal portions of the exposed surface of the substrate.

Figure 18:
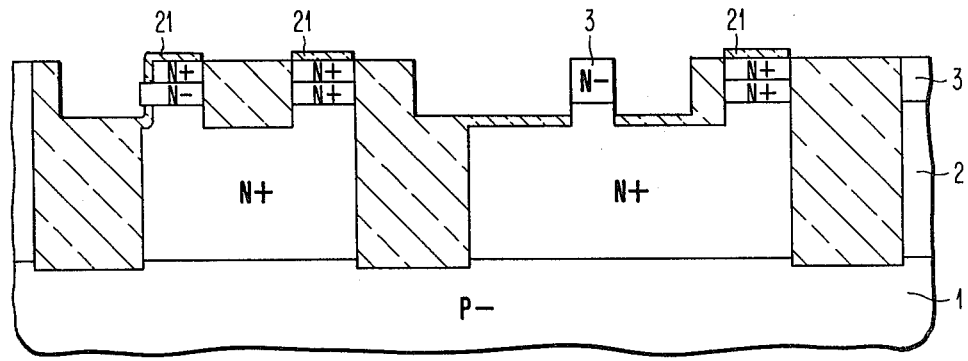

Employ an aqua regia solution to remove the platinum film 17. Thermally oxidize the exposed surface of the substrate. It is well known that the more heavily doped (N+) silicon regions will oxidize at an appeciably faster rate than the lightly doped (N−) silicon regions. The thermal oxidation is carried out at a temperature of approximately 800° to 900° C. to grow a relatively thick oxide layer 21 (250 nanometers) on the N+ regions and a relatively thin oxide layer (50 nanometers, not shown in the drawing) on the N− regions. Remove the thin oxide (50 nanometers) by a "dip open" of the exposed surface of the substrate. In this step (dip open) a suitable etchant solution such as buffer HF solution is used to remove all of the thin oxide (not shown) on the N− regions and approximately less than 100 nanometers of the relatively thick oxide layer 21 on the N+ regions. FIG. 18 schematically depicts a crosssectional view of the substrate at this stage of the process.

Figure 19:
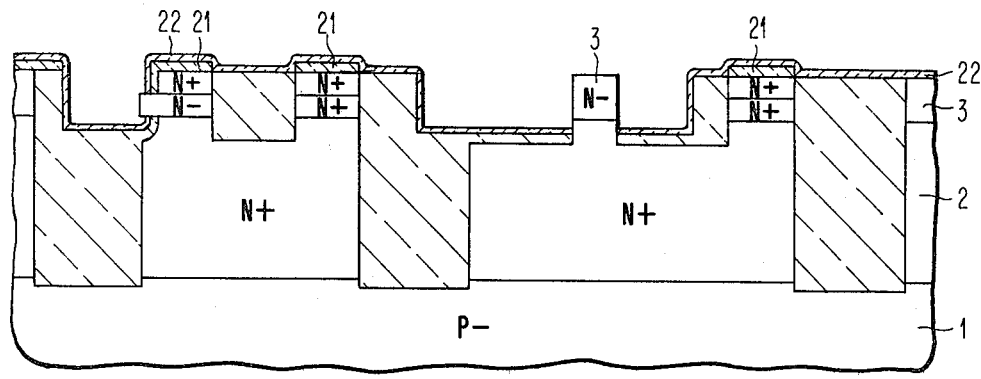

Chemically vapor deposit (CVD) a film 22 of Si$_3$N$_4$ on the exposed surface of the substrate. The silicon nitride film 22 preferably has thickness of approximately 50 nanometers. The silicon nitride film coats the entire exposed surface of the substrate. Convert the Si$_3$N$_4$ film on the N− regions to anodic silicon dioxide. The silicon nitride on the oxide regions and on the N+ regions will not be converted to anodic SiO$_2$. [Reference is made to the article "Conversion of Silicon Nitride Films to Anodic SiO$_2$" by P. F. Schmidt and D. R. Wonsidler (Bell Telephone Laboratories), Journal of The Electrochemical Society, January 1967, 603-5]. The anodic SiO$_2$ on the N− regions is removed by dip etching in a buffer-HF solution. FIG. 19 schematically depicts a cross-sectional view of the substrate at this stage of the process.

Figure 20:
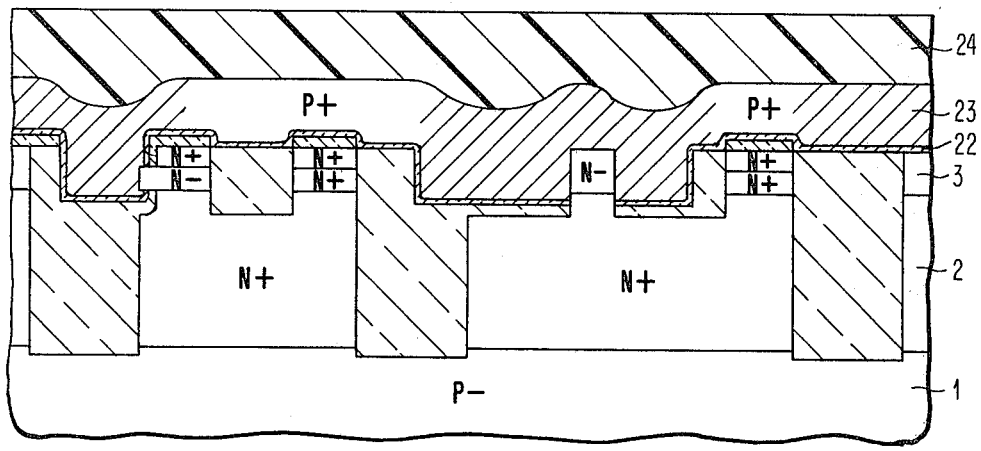

Chemically vapor deposit a P+ polysilicon layer 23 on the exposed surface of the substrate. The polysilicon layer is formed preferably by low pressure chemical vapor deposition process to achieve good thickness uniformity. Alternatively, undoped polysilicon may be deposited and then implanted with boron ions. The polysilicon layer 23 (FIG. 20) is preferably approximately 800 nanometers in thickness and fills the recesses R1, R2 and R3 (FIG. 19), in the exposed surface of the substrate. A blanket resist layer 24 is next deposited and treated appropriately to planarize the polysilicon surface 23. The subsequent process step is the use of RIE to thin back the resist layer 24 (FIG. 20) and polysilicon layer 23. Of primary importance is that the etch rate of RIE resist is nearly equal to that of RIE polysilicon. Thus, with an equal thickness of resist and polysilicon everywhere over the exposed surface of the substrate, a back-etching to the silicon nitride layer 22 will yield a planar surface with filled in recesses R1, R2 and R3. It is known that the silicon nitride layer 22 will act as an etch stop under correctly chosen etch conditions. (As will be fully apparent hereinafter, the P+ doped polysilicon of filled recess R1 provides the base contact to the base of the NPN device, the P+ doped polysilicon of filled recess R2 provides the collector contact of the PNP device, and the P+ doped polysilicon of filled recess R3 provides the emitter contact of the PNP device). (IBM Technical Disclosure Bulletin publications: "Removal of Quartz Spikes Over Metal Lands" by J. J. Colacino et al., Vol. 20, No. 4, September 1977, page 1381; and "Reestablishing Parallelism After RIE Etching", Vol. 21, No. 5, October 1978, pages 1849 and 1850).

Figure 21:
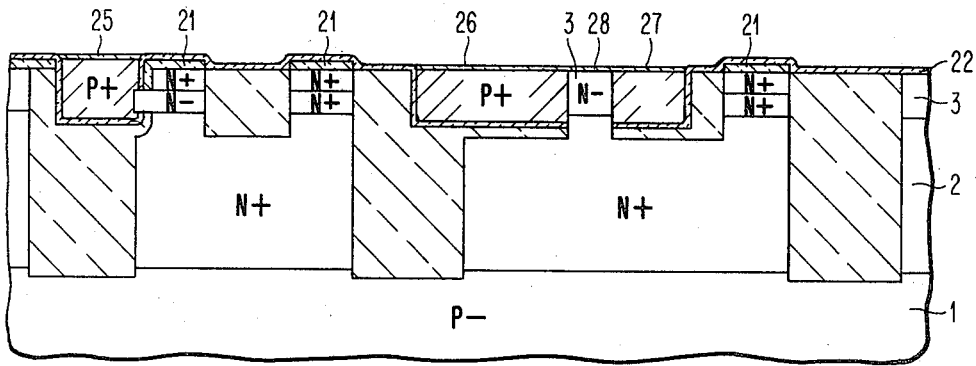

FIG. 21 schematically depicts a cross-sectional view of the substrate at this stage of the process.

Figure 22:
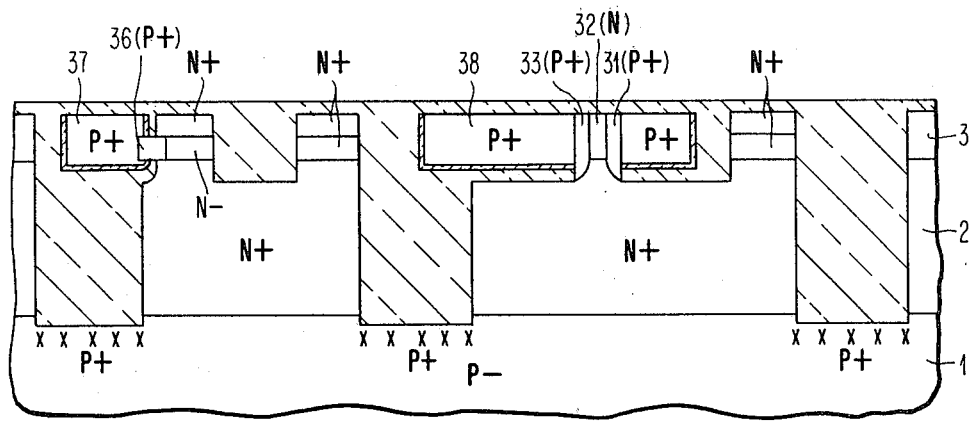

Thermally oxidize the exposed surface of polysilicon regions 25, 26 and 27 (FIG. 21) to a thickness approximately 250 nanometers. To minimize the outdiffusion of the doping impurities during oxide growth, preferably a high pressure oxidation should be used. Both the surface of the polysilicon regions and the exposed surface (28, FIG. 21) of the lateral PNP device oxidize during this step. During this oxidation process the emitter and collector contacts of NPN device are protected from oxidation by Si$_3$N$_4$ layer 22. The emitter 31 (FIG. 22) and collector 33 of the lateral PNP device (31, 32, 33, FIG. 22) are formed during this thermal treatment by boron diffusing from the doped polysilicon 38, 39 into the N− region. At the same time, boron diffuses from the polysilicon 37 into the base region 36 of the vertical NPN device. Next, the Si$_3$N$_4$ layer 22 is stripped by using a warm H$_3$PO$_4$ solution. FIG. 22 schematically depicts a cross-sectional view of the substrate at this stage of the process.

Figure 23:
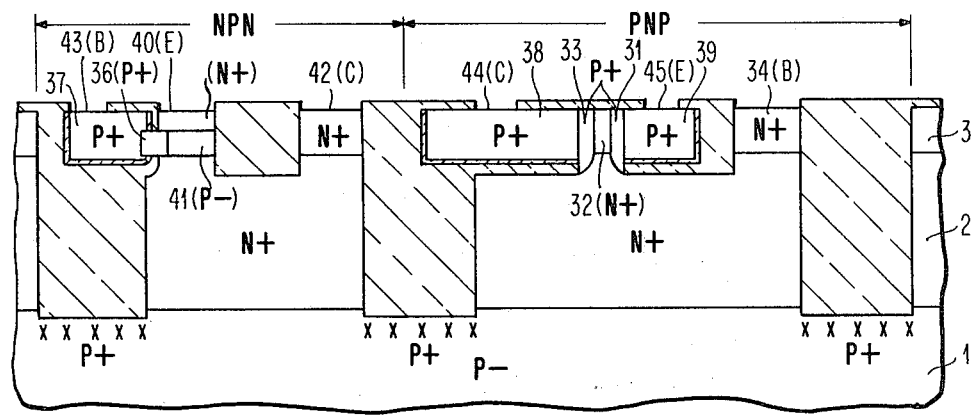
Figure 24:
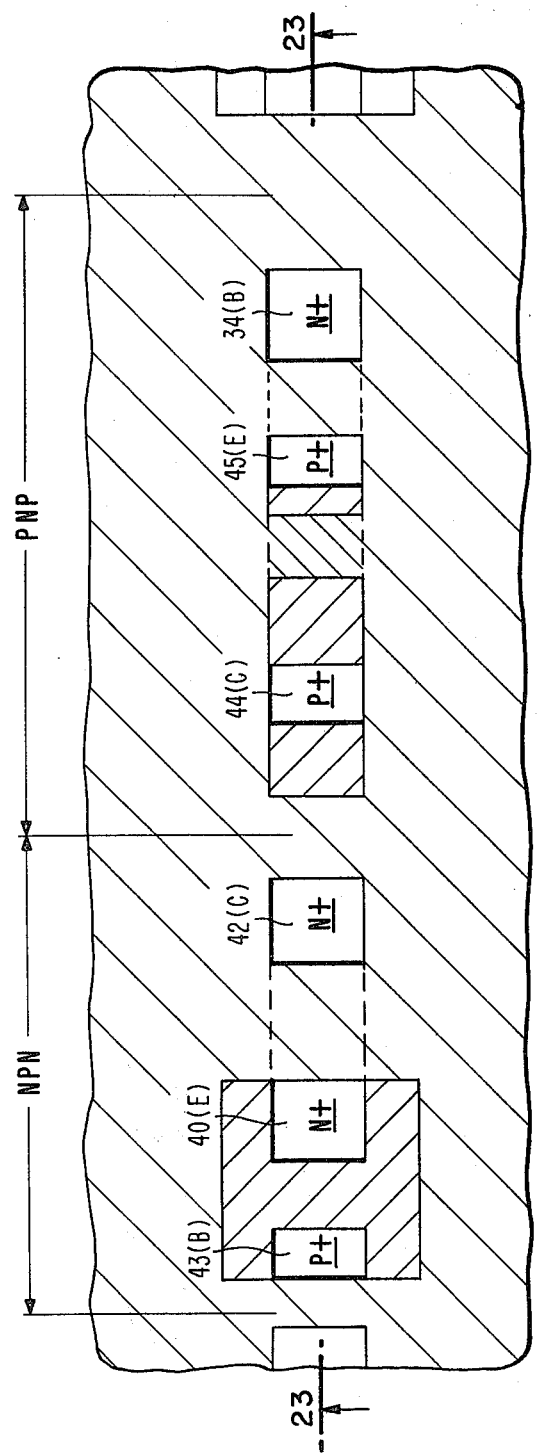
FIG. 24 is a top view of the complementary transistor structure of FIG. 23.

Utilizing a CF$_3$/H$_2$ reactive ion etching which has a very low silicon etch rate or a buffer-HF oxide etching solution, etch the silicon dioxide on the exposed surface of the substrate. This will remove the thinner SiO$_2$ (original oxide layer 21) over the N+ regions and reduce the silicon dioxide over the polysilicon regions 37, 38 and 39 and the top of the PNP device to approximately 100 nanometers. Utilizing a suitable photoresist mask (not shown) define the to be formed base region of the NPN device. Then using said mask ion implant boron ions at an energy of about 30–50 keV and a dose of about $1 \times 10^{13}$ ions/cm$^2$ to form the base region 41 (FIG. 23) of the vertical NPN device. This is not a critical dimension masking operation since the active region of the NPN is surrounded entirely by thick SiO$_2$ isolation and polysilicon already heavily doped P-type. Remove the photoresist mask. Activate the ion implanted boron by a 900° C.-N$_2$ anneal cycle. This is a standard activation anneal for implant. The lateral PNP (31, 32, 33) will also be affected since the emitter 31 and collector 33 will out diffuse during this step resulting in further narrowing of the N-type base region 32 between them. Utilizing a photoresist contact mask (not shown) open contacts 43, 44 and 45 respectively to the polysilicon regions 37, 38 and 39. Contact 43 provides the metal to base contact of the NPN device. Contacts 44 and 45 respectively are the collector and emitter contacts of the PNP device.

While this invention has been particularly described with reference to the preferred embodiments thereof, it will be understood by those skilled in the art that the foregoing and other changes in form and details may be made therein without departing from the spirit and scope of the invention.

We claim:

1. In an integrated circuit structure including a vertical NPN transistor and a lateral PNP transistor, said NPN transistor being electrically isolated from said PNP transistor, said structure including a monolithic crystalline silicon substrate having a planar surface, a thin epitaxial layer contained on said planar surface of said substrate and monolithically integral with said monolithic crystalline silicon substrate, said thin epitaxial layer having recessed oxide isolation regions and P type polysilicon regions formed therein, said integrated circuit structure being characterized as follows:

a first electrically isolated P type polysilicon region formed in said epitaxial layer and having at least one perpendicular side wall, said first electrically isolated P type polysilicon region extending laterally in said epitaxial layer in a first direction;

a second electrically isolated P type polysilicon region formed in said epitaxial layer and having at least one perpendicular side wall, said second electrically isolated P type polysilicon region extending laterally in said epitaxial layer in a second direction opposite to said first direction;

said side wall of said second P type polysilicon region being oppositely disposed and spaced from said side wall of said first P type polysilicon region;

said spacing between said perpendicular side walls of said first and second P type polysilicon regions providing a region of said epitaxial layer having a width in the order of 6000 to 8000 Å;

a lateral PNP transistor formed in said in the order of 6000 to 8000 Å wide region of said epitaxial layer, said lateral PNP transistor having an emitter region, a base region and a collector region, where said first P type polysilicon region provides electrical contact to said emitter region of said lateral PNP transistor and said second P type polysilicon region provides electrical contact to said collector region of said PNP transistor, an N type base reach through region for said base region of said lateral PNP transistor, said N type base reach through region being contained essentially within said epitaxial layer and remote from and electrically isolated from said first and second electrically isolated P type polysilicon regions;

a vertical NPN transistor having an emitter region, a base region and a collector region, said emitter region of said NPN transistor having a shallow depth, a limited area and an exposed planar surface, said base region of said NPN transistor having a shallow depth, said base region of said NPN transistor having a limited area essentially equal in area to said limited area of said emitter region of said NPN transistor, said base region of said NPN transistor providing an essentially planar emitter-base junction, said emitter-base junction having an area corresponding essentially to said limited area of said emitter and base regions of said NPN transistor, said base region having a contact region laterally displaced from said emitter-base junction;

a third electrically isolated P type polysilicon region formed in said epitaxial layer, said third polysilicon region laterally extending in said second direction from said base region of said NPN transistor, said third polysilicon region physically and electrically contacting said laterally displaced base contact region of said NPN transistor; and an N type collector reach through region for said NPN transistor, said N type collector reach through region being contained within said epitaxial layer remote from and electrically isolated from said first, second and third electrically isolated P type polysilicon regions.

2. In an integrated circuit structure including a vertical NPN transistor (40, 41, 42, FIG. 23) and a lateral PNP transistor (31, 32, 33, FIG. 23), said NPN transistor being electrically isolated from said PNP transistor, said structure including a monolithic crystalline silicon substrate having a planar surface, a thin epitaxial layer (3, FIG. 23) contained on said planar surface of said substrate and monolithically integral with said monolithic crystalline silicon substrate, (1, FIG. 23), said thin epitaxial layer having recessed oxide isolation regions and P type polysilicon regions formed therein, said integrated circuit structure being characterized as follows:

a first electrically isolated P type polysilicon region (39, FIG. 23) formed in said epitaxial layer and having at least one perpendicular side wall, said first electrically isolated P type polysilicon region extending laterally in said epitaxial layer in a first direction;

a second electrically isolated P type polysilicon region (38, FIG. 23) formed in said epitaxial layer and having at least one perpendicular side wall, said second electrically isolated P type polysilicon region extending laterally in said epitaxial layer in a second direction opposite to said first direction;

said side wall of said second P type polysilicon region being oppositely disposed and spaced from said side wall of said first P type polysilicon region;

said spacing between said perpendicular side walls of said first and second P type polysilicon regions providing a region of said epitaxial layer (31, 32, 33, FIG. 23) having a width in the order of 6000 to 8000 Å;

a lateral PNP transistor formed in said in the order of 6000 to 8000 Å wide region of said epitaxial layer, said lateral PNP transistor having an emitter region (31, FIG. 23), a base region (32, FIG. 23) and a collector region (33, FIG. 23), where said first P type polysilicon region provides electrical contact to said emitter region of said lateral PNP transistor and said second P type polysilicon region provides electrical contact to said collector region of said PNP transistor, an N type base reach through region (34, FIG. 23) for said base region of lateral PNP transistor, said N type base reach through region being contained essentially within said epitaxial layer and remote from and electrically isolated from said first and second electrically isolated P type polysilicon regions;

a vertical NPN transistor having an emitter region, a base region and a collector region, said emitter region (40, FIG. 23) of said NPN transistor having a shallow depth, a limited area and an exposed planar surface, said base region (41, FIG. 23) of said NPN transistor having a shallow depth, said base region of said NPN transistor having a limited area essentially equal in area to said limited area of said emitter region of said NPN transistor, said base region of said NPN transistor providing an essentially planar emitter-base junction, said emitter-base junction having an area corresponding essentially to said limited area of said emitter and base regions of said NPN transistor, said base region having a contact region (36, FIG. 23) laterally displaced from said emitter-base junction;

a third electrically isolated P type polysilicon region (37, FIG. 23) formed in said epitaxial layer, said third polysilicon region laterally extending in said second direction from said base region of said NPN transistor, said third polysilicon region physically and electrically contacting said laterally displaced base contact region of said NPN transistor; and an N type collector reach through region (42, FIG. 23) for said NPN transistor, said N type collector reach through region being contained within said epitaxial layer remote from and electrically isolated from said first, second and third electrically isolated P type polysilicon regions.

3. In an integrated circuit structure including a vertical NPN transistor and a lateral PNP transistor, said NPN transistor being electrically isolated from said PNP transistor, said structure including a monolithic crystalline silicon substrate having a planar surface, a thin epitaxial layer contained on said planar surface of said substrate and monolithically integral with said monolithic crystalline silicon substrate, said thin epitaxial layer having recessed oxide isolation regions and P type polysilicon regions formed therein, said integrated circuit structure being characterized as follows:

a first electrically isolated P type polysilicon region formed in said epitaxial layer and having at least one perpendicular side wall, said first electrically isolated P type polysilicon region extending laterally in said epitaxial layer in a first direction;

a second electrically isolated P type polysilicon region formed in said epitaxial layer and having at least one perpendicular side wall, said second electrically isolated P type polysilicon region extending laterally in said epitaxial layer in a second direction opposite to said first direction;

said side wall of said second P type polysilicon region being oppositely disposed and spaced from said side wall of said first P type polysilicon region, said spacing between said perpendicular side walls of said first and second P type polysilicon regions containing a region of said epitaxial layer;

a lateral PNP transistor formed in said region of said epitaxial layer contained between said side walls of said first and second P type polysilicon regions, said lateral PNP transistor having an emitter region, a base region and a collector region, where said first P type polysilicon region provides electrical contact to said emitter region of said lateral PNP transistor and said second P type polysilicon region provides electrical contact to said collector region of said PNP transistor, an N type base reach through region for said base region of lateral PNP transistor, said N type base reach through region being contained essentially within said epitaxial layer and remote from and electrically isolated from said first and second electrically isolated P type polysilicon regions;

a vertical NPN transistor having an emitter region, a base region and a collector region, said emitter region of said NPN transistor having a shallow depth, a limited area and an exposed planar surface, said base region of said NPN transistor having a shallow depth, said base region of said NPN transistor having a limited area essentially equal in area to said limited area of said emitter region of said NPN transistor, said base region of said NPN transistor providing an essentially planar emitter-base junction, said emitter-base junction having an area corresponding essentially to said limited area of said emitter and base regions of said NPN transistor, said base region having a contact region laterally displaced from said emitter-base junction;

a third electrically isolated P type polysilicon region formed in said epitaxial layer, said third polysilicon region laterally extending in said second direction from said base region of said NPN transistor, said third polysilicon region physically and electrically contacting said laterally displaced base contact region of said NPN transistor; and an N type collector reach through region for said NPN transistor, said N type collector reach through region being contained within said epitaxial layer remote from and electrically isolated from said first, second and third electrically isolated P type polysilicon regions.

* * * * *